(12) United States Patent
Segarra

(10) Patent No.: US 10,693,426 B2
(45) Date of Patent: Jun. 23, 2020

(54) INTEGRATED AMPLIFIER DEVICES AND METHODS OF USE THEREOF

(71) Applicant: Intrinsix Corp., Marlborough, MA (US)

(72) Inventor: Daniel J. Segarra, Southborough, MA (US)

(73) Assignee: INTRINSIX CORP., Marlborough, MA (US)

( * ) Notice: Subject to any disclaimer, the term of this patent is extended or adjusted under 35 U.S.C. 154(b) by 2 days.

(21) Appl. No.: 16/203,741

(22) Filed: Nov. 29, 2018

(65) Prior Publication Data

US 2019/0173442 A1 Jun. 6, 2019

Related U.S. Application Data

(60) Provisional application No. 62/592,063, filed on Nov. 29, 2017.

(51) Int. Cl.
*H03F 3/45* (2006.01)
*H03D 7/14* (2006.01)
*H03F 1/26* (2006.01)

(52) U.S. Cl.
CPC ......... *H03F 3/45538* (2013.01); *H03D 7/145* (2013.01); *H03D 7/1441* (2013.01); *H03D 7/1491* (2013.01); *H03F 1/26* (2013.01); *H03F 3/4565* (2013.01); *H03F 3/45089* (2013.01); *H03F 3/45094* (2013.01); *H03F 3/45475* (2013.01); *H03F 2200/453* (2013.01)

(58) Field of Classification Search
CPC ................. H03F 3/04; H03F 3/45; H03F 3/68
USPC ......................................... 330/261, 295, 296
See application file for complete search history.

(56) References Cited

U.S. PATENT DOCUMENTS

| 5,434,538 A * | 7/1995 | Lee .......................... H03F 3/211 330/124 R |
|---|---|---|
| 5,559,470 A | 9/1996 | Laber et al. |

OTHER PUBLICATIONS

Steininger, "Understanding Wide-band MOS Transistors", May 1990, pp. 26-32.
Laber et al., "A 20-MHz Sixth-Order BiCMOS Parasitic-Insensitive Continuous-Time Filter and Second-Order Equalizer Optimized for Disk-Drive Read Channels", IEEE Journal of Solid State Circuits, Apr. 1993, pp. 462-470, vol. 28, No. 4.

\* cited by examiner

*Primary Examiner* — Steven J Mottola
(74) *Attorney, Agent, or Firm* — Pepper Hamilton LLP

(57) ABSTRACT

An integrated amplifier device includes a main amplifier configured to be coupled to an input source. A replica amplifier is coupled to the main amplifier to provide a bias to the main amplifier. A transconductance biasing cell to the main amplifier and the replica amplifier. The transconductance biasing cell is configured to bias both the main amplifier and the replica amplifier. A method of making an integrated amplifier device is also disclosed.

16 Claims, 7 Drawing Sheets

Main Amplifier Circuit

Replica LNA Circuit (without startup circuit)

INTEGRATED AMPLIFIER DEVICES AND METHODS OF USE THEREOF

This application claims the benefit of U.S. Provisional Patent Application Ser. No. 62/592,063, filed Nov. 29, 2017, which is hereby incorporated by reference in its entirety.

FIELD

The present technology relates to integrated amplifier devices and methods of use thereof. More specifically, the present technology relates to low noise integrated amplifier devices utilizing a replica amplifier.

BACKGROUND

Instrumentation amplifiers are essentially devices that provide voltage gain for small signals that are frequently accompanied by common-mode noise. Instrumentation amplifiers are most often differential input, single ended output amplifiers. To be good voltage amplifiers, instrumentation amplifiers must place minimal loading on the signal source. For this reason, the gain-setting feedback elements are normally internal to the instrumentation amplifiers. Further, the gain -setting feedback elements must have good common-mode rejection, which places importance on tight device matching such that the gain-setting feedback elements are best implemented in integrated form.

Most such devices use operational amplifier buffers at each input. This produces very high input impedance as required, but demands high speed from the operational amplifiers so that the internal virtual nodes can remain pinned down over the frequency range of interest. The devices often use bipolar or BiCMOS processes to meet performance objectives, while some require laser trimming of on -chip resistors to meet accuracy requirements. This adds to the complexity of the integrated circuits External resistors may be used to set gain. However, such resistors do not match internal integrated circuit resistors and have different temperature coefficients, which degrade accuracy.

SUMMARY

An integrated amplifier device includes a main amplifier configured to be coupled to an input source. A replica amplifier is coupled to the main amplifier to provide a bias to the main amplifier. A transconductance biasing cell is coupled to the main amplifier and the replica amplifier. The transconductance biasing cell is configured to bias both the main amplifier and the replica amplifier.

A method of making an integrated amplifier device includes providing a main amplifier configured to be coupled to an input source. A replica amplifier is coupled to the main amplifier to provide a bias to the main amplifier. A transconductance biasing cell is coupled to the main amplifier and the replica amplifier. The transconductance biasing cell is configured to bias both the main amplifier and the replica amplifier The present technology provides a low-noise, wide bandwidth, AC or DC coupled, small-signal, fully-differential instrumentation amplifier with solid performance over the military temperature range. The amplifier of the present technology is designed to be rugged and transportable to multiple integrated circuit processes. The present technology advantageously allows for the extraction of small signals from a noisy environment and rejects common-mode signals without loading the signal source, while maintaining stable gain, low noise, and wide bandwidth. The technology may be implemented in standard CMOS, making it viable for large, integrated, mixed-signal systems.

DETAILED DESCRIPTION

Figure 1:
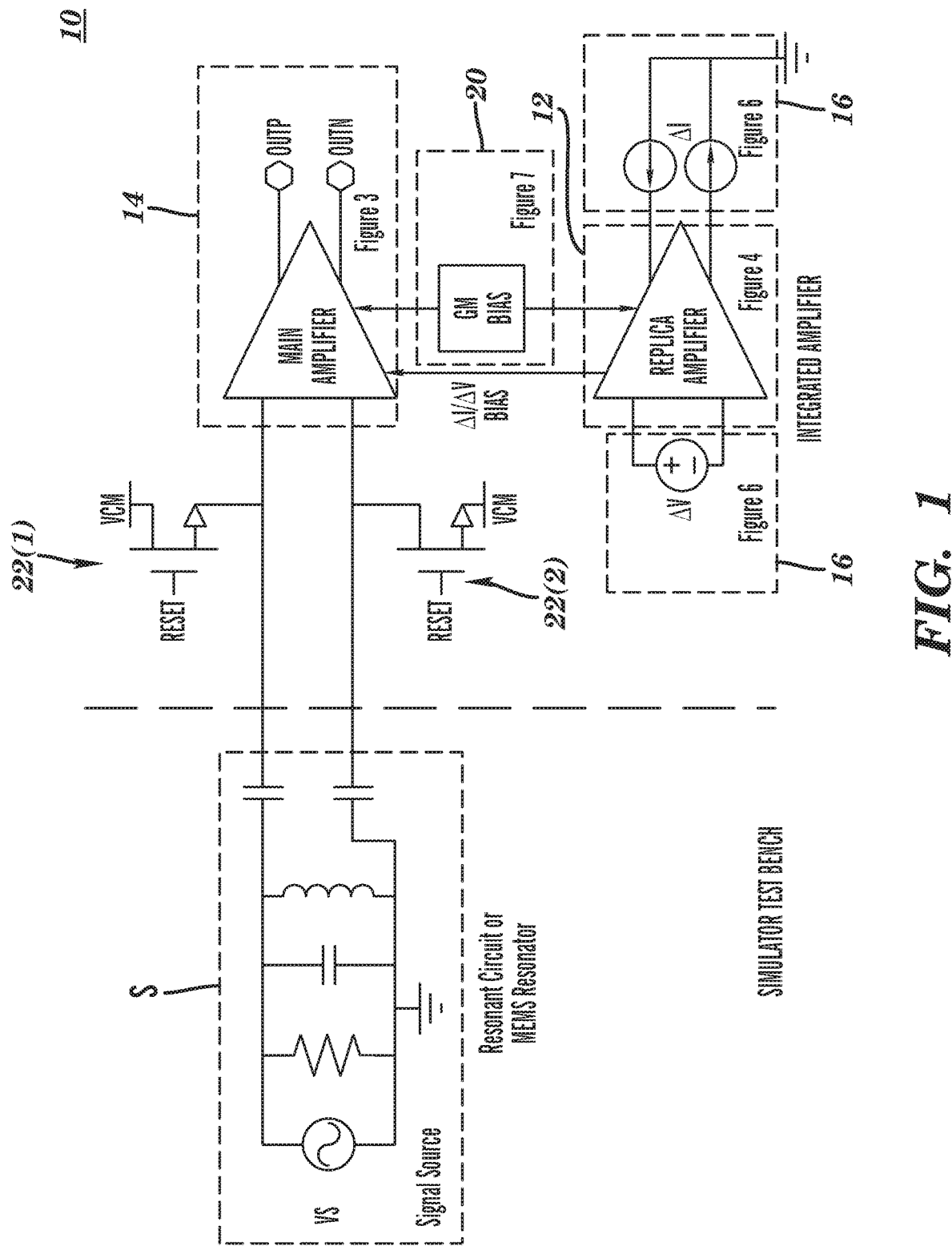
FIG. 1 is a schematic of an exemplary integrated amplifier circuit, including a replica low-noise amplifier, coupled to an alternating current (AC) source.
Figure 2:
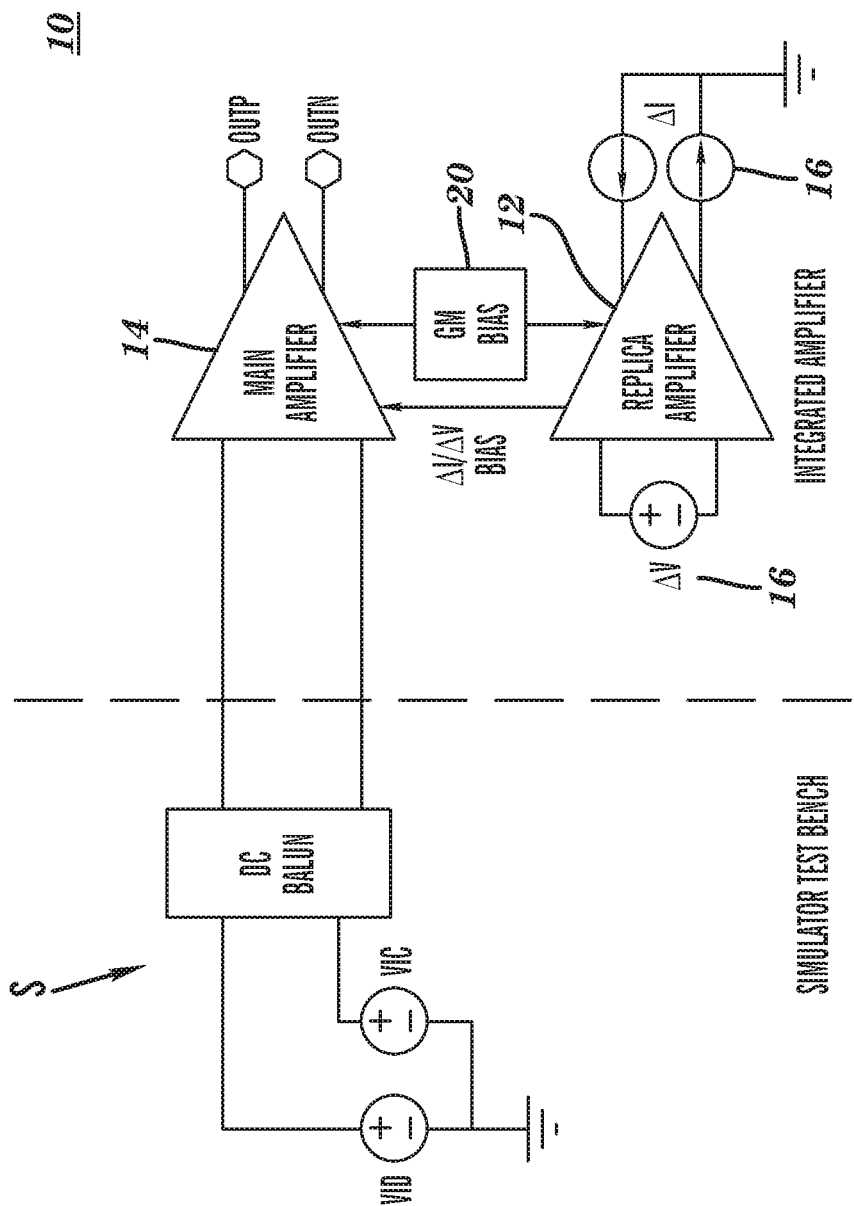
FIG. 2 is a schematic of another exemplary integrated amplifier circuit, including a replica low-noise amplifier, coupled to a direct current (DC) source.

An exemplary integrated amplifier circuit 10 including a replica low noise amplifier (LNA) 12 is illustrated in FIGS. 1-7. The exemplary integrated amplifier circuit 10 is illustrated coupled to an input source (S), which is separated from the integrated amplifier circuit 10 by a dashed line for illustration purposes. Inputs source (S) can be an alternating current input source as illustrated in FIG. 1 or a direct current input source as illustrated in FIG. 2.

In this example, the integrated amplifier circuit 10 includes the replica LNA 12, a main amplifier 14 coupled to the signal source (S), a voltage and current reference circuit 16, and a transconductance (Gm) bias cell 20, although the integrated amplifier circuit 10 may include other types and/or numbers of other systems, devices, components, and/or other elements in other configurations, such as reset switches 22(1) and 22(2), by way of example, when utilized with an alternating current source as shown in FIG. 1.

The exemplary integrated amplifier circuit 10 may be utilized in a number of applications including acquiring low-frequency frequency-division multiplexing (FDM) signals, isolated systems for high-voltage industrial or medical applications, or low-noise amplification of small signals. More specifically, the technology may be employed, by way of example, in applications where accurate gain of small signals must be provided in the presence of common-mode voltages that must be rejected. Such applications include, by way of example only, imaging, industrial measurement (light, temperature, pressure), medical (ECG, imaging), data acquisition, or as a bridge or transformer interface. The technology also may be employed where isolation is required such as when signal information floats on large voltages, or in the case of medical devices where patients must be isolated for safety.

Referring now more specifically to FIGS. 1 and 2, the main amplifier 14 is connected to a signal source (S) that provides a single to the input of the main amplifier 14. In one example, as illustrated in FIG. 1, the main amplifier 14 is connected to an alternating current source, such as a resonant circuit or MEMS resonator by way of example only, although the main amplifier 14 may be coupled to other alternating current signal sources. In this example, reset switches 22(1) and 22(2) are placed between the signal source (S) and the main amplifier 14 in order to set the input common-mode level of the signal delivered to the input of the main amplifier 14. The reset switches 22(1) and 22(2) are open during operation and present an extremely small resistive and capacitive load. In another example, as shown in FIG. 2, the main amplifier 14 may be coupled to a direct current source. In this example, no reset switches are required to set the common-mode level.

Figure 3:
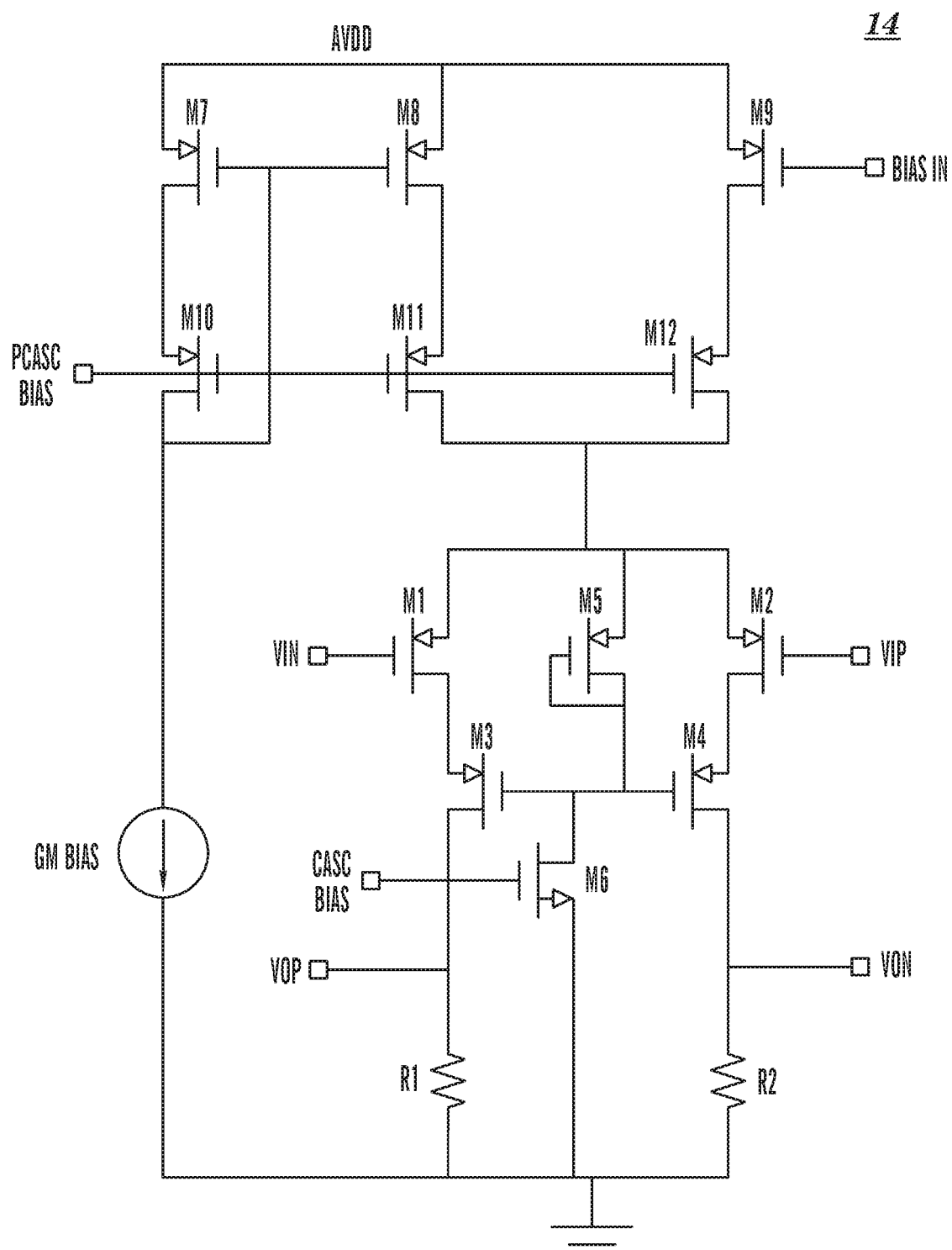
FIG. 3 is a schematic of an exemplary main amplifier circuit for use with the integrated amplifier circuit illustrated in FIGS. 1 and 2.

Referring again to FIGS. 1 and 2, the replica LNA 12 is identical in structure to the main amplifier 14 as described in further detail below. An exemplary circuit diagram for the main amplifier 14 is illustrated in FIG. 3. Referring now to FIGS. 1-3, the main amplifier 14 is coupled to the replica LNA 12 to receive a BIAS IN input from the replica LNA 12 as shown in FIG. 3. In this manner, the main amplifier 14 tracks the replica LNA 12 over process, supply voltage, and temperature variations. The main amplifier 14 is also coupled to the GM bias cell 20 to receive a GM BIAS current. The main amplifier 14 is coupled to the input source (S) to receive the applied signal from the input source (S). The main amplifier 14 delivers an amplified output as described in further detail below.

Figure 4:
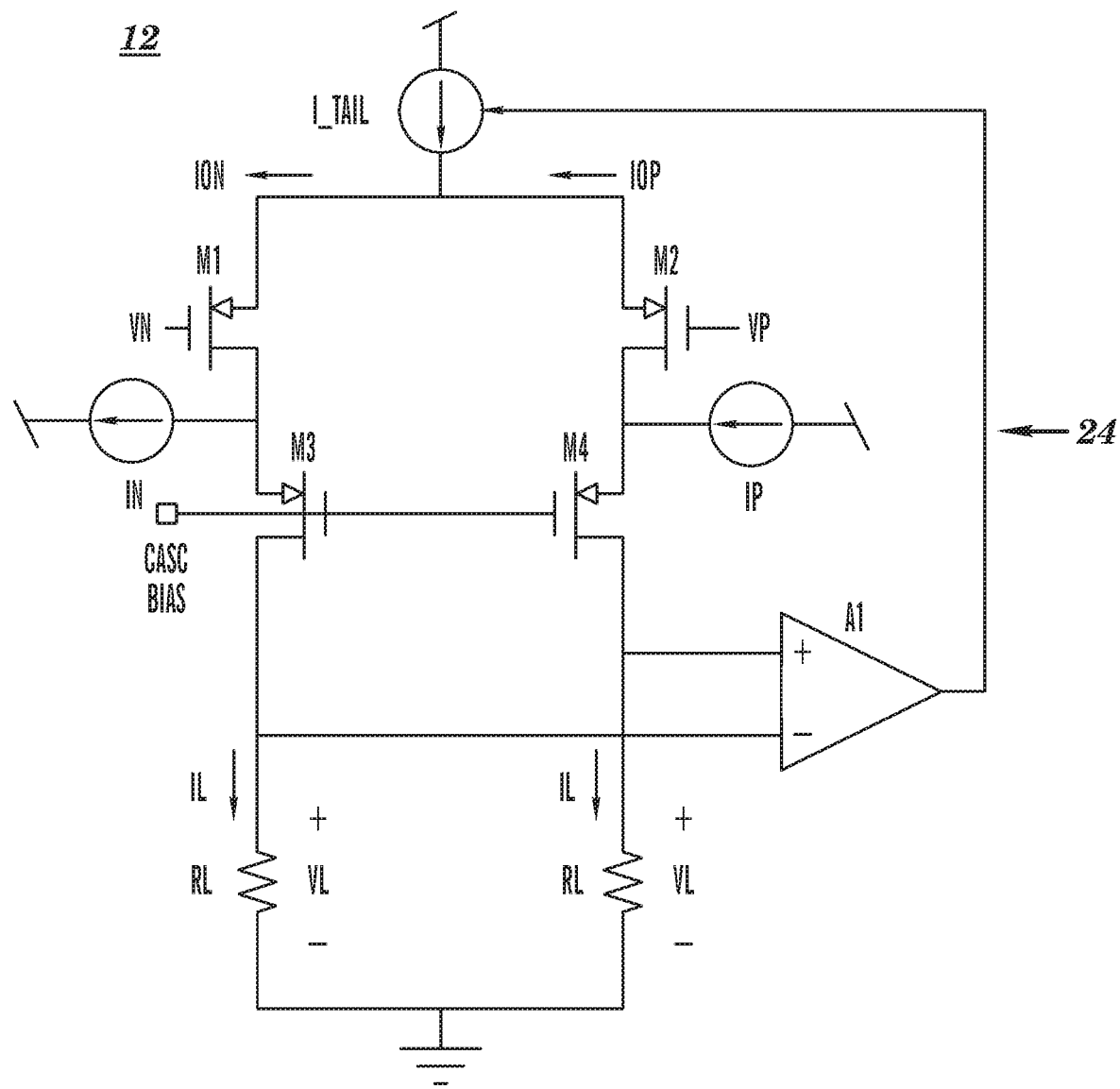
FIG. 4 is a schematic of an exemplary replica low noise amplifier circuit, without a start-up circuit, for use with the integrated amplifier circuit illustrated in FIGS. 1 and 2.

Referring again to FIGS. 1 and 2, the replica LNA 12 is coupled to the main amplifier 14 to provide the bias input (BIAS IN) to the main amplifier 14 as described in further detail below. An exemplary circuit diagram for the replica LNA 12 (without a start-up circuit) is illustrated in FIG. 4. In this example, the replica LNA 12 includes a cascode resistively loaded source-coupled pair of transistors (M1, M2 and M3, M4). The replica LNA 12 further includes equal valued load resistors RL that receive the output currents (IL) of the replica LNA 12. In this example, the resistive loads (RL) are chosen in favor of current mirrors in order to reduce noise.

Figure 5:
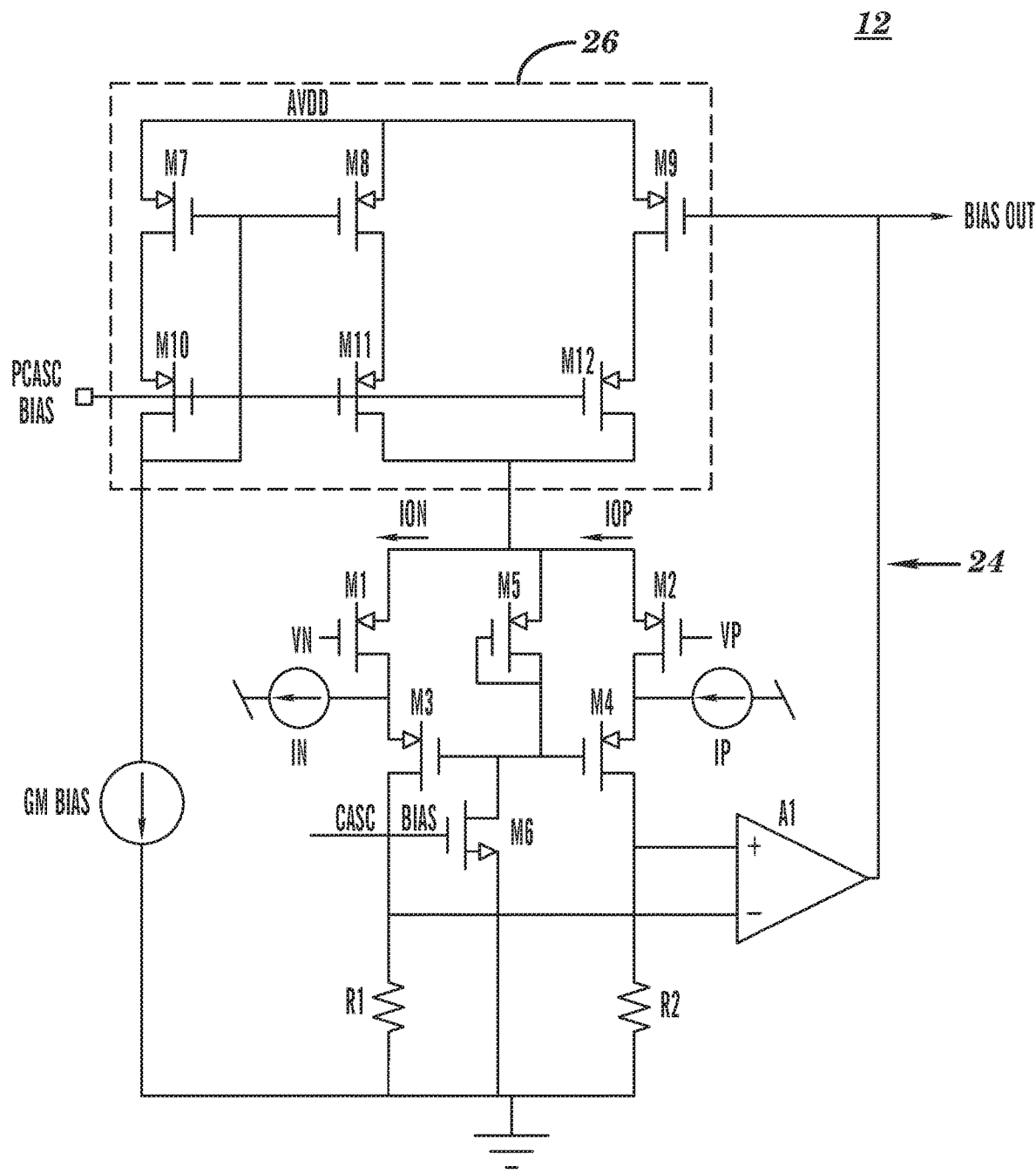
FIG. 5 is a schematic of an exemplary replica low noise amplifier circuit, with a start-up circuit, for use with the integrated amplifier circuit illustrated in FIGS. 1 and 2.

The replica LNA 12 further includes a servo-loop 24 around the replica LNA 12 driven by operational amplifier (A1). The operational amplifier (A1) drives the tail current to set the transconductance of the replica LNA 12. The operational amplifier (A1) drives the tail current (I_TAIL) such that its input voltages are equal, which means the circuit in FIG. 4 has a stable state at VL=0 and IL=0 so a startup circuit is needed. An exemplary replica LNA 12 including a startup circuit 26 is illustrated in FIG. 5.

Referring again to FIGS. 1 and 2, the replica LNA 12 also is coupled to the voltage and current reference circuit 16. In this example, the input differential voltage ($\Delta V$) from the voltage and current reference circuit 16 is applied to the input of the replica amplifier 12, while a differential current ($\Delta I$) provided by the voltage and current reference circuit 16 bucks the output of the replica LNA 12. The voltage and current reference circuit 16 does not interact with the main amplifier 14.

Figure 6:
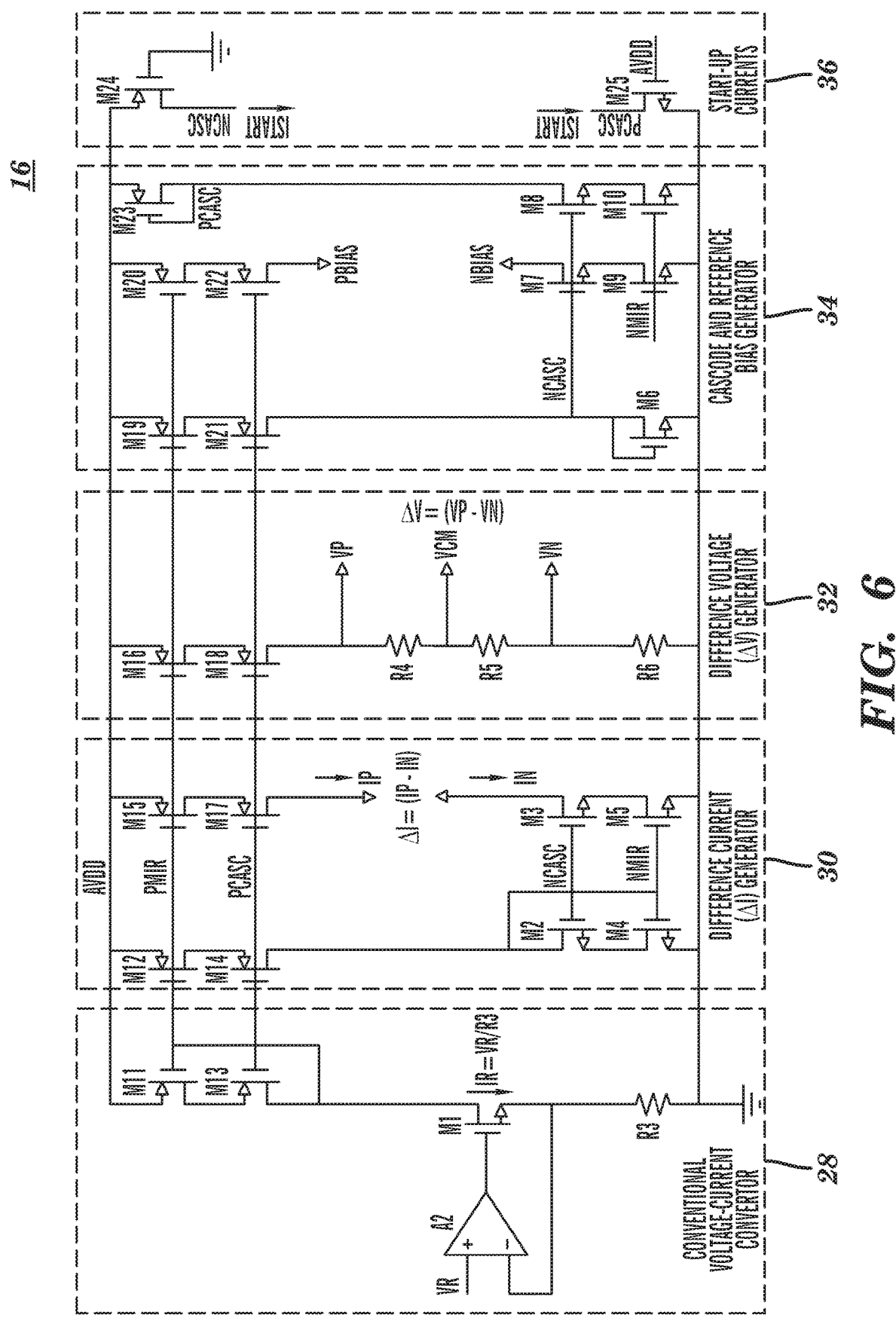
FIG. 6 is a schematic of an exemplary voltage and current reference circuit for use with the integrated amplifier circuit illustrated in FIGS. 1 and 2.

An exemplary voltage and current reference circuit 16 is illustrated in FIG. 6. In this example, the voltage and current reference circuit 16 includes a voltage-current converter circuit 28, a differential current generator 30, a differential voltage generator 32, a cascode and reference bias generator 34, and a startup circuit 36, although the voltage and current reference circuit 16 may include other types of circuits.

As shown in FIG. 6, the voltage-current converter circuit 28 includes an operational amplifier (A2) that receives a reference voltage (VR). The voltage-current converter circuit 28 further includes an on-chip resistor (R3). The voltage-current converter circuit 28 is then coupled to the differential current generator 30 to deliver the reference current (IR) to the differential current generator 30.

The differential current generator 30 is coupled to the voltage-current converter 28 to receive the generated reference current (IR). The differential current generator 30 is configured such that the reference current (IR) is mirrored to generate a differential current ($\Delta I$). The differential current generator 30 is coupled to the replica LNA 12 and delivers the generated differential current ($\Delta I$) to the output of the replica LNA 12 as shown in FIGS. 1 and 2.

Referring again to FIG. 6, the differential voltage generator 32 is coupled to the voltage-current converter 28 to receive the generated reference current (IR). The reference current (IR) is mirrored through resistors R4 and R5 to generate the differential voltage $\Delta V$. The differential voltage generator 32 is coupled to the replica LNA 12 to deliver the differential voltage ($\Delta V$) to the input of the replica LNA 12 as shown in FIGS. 1 and 2. Referring again to FIG. 6, resistor R6 is used to set the voltage-common mode (VCM). The VCM is used for the reset switches 22(1) and 22(2) to set the common mode in the alternating current example as illustrated in FIG. 1. The VCM can also be used to set the DC common-mode voltage as applied to the DC balun in FIG. 2.

In this example, the voltage and current reference circuit 16 also includes a cascode and reference bias generator 34 to provide a cascode bias and reference bias to both the replica LNA 12 and the main amplifier 14. The voltage and current reference circuit 16 also includes a startup circuit 36 to provide startup currents for the voltage and current reference circuit 16.

Referring again to FIGS. 1 and 2, the transconductance (Gm) bias cell 20 is coupled to both the main amplifier 14 and the replica LNA 12 to provide an identical Gm bias to both amplifiers. In this example, the Gm bias cell 20 is a conventional resistor tracking bias that provides both the replica LNA 12 and the main amplifier 14 with a bias that is close to the target bias. No feedback connections are made to the input of the main amplifier 14, which minimizes the signal source loading and allows resonant sources to maintain a high selectivity (Q value).

Figure 7:
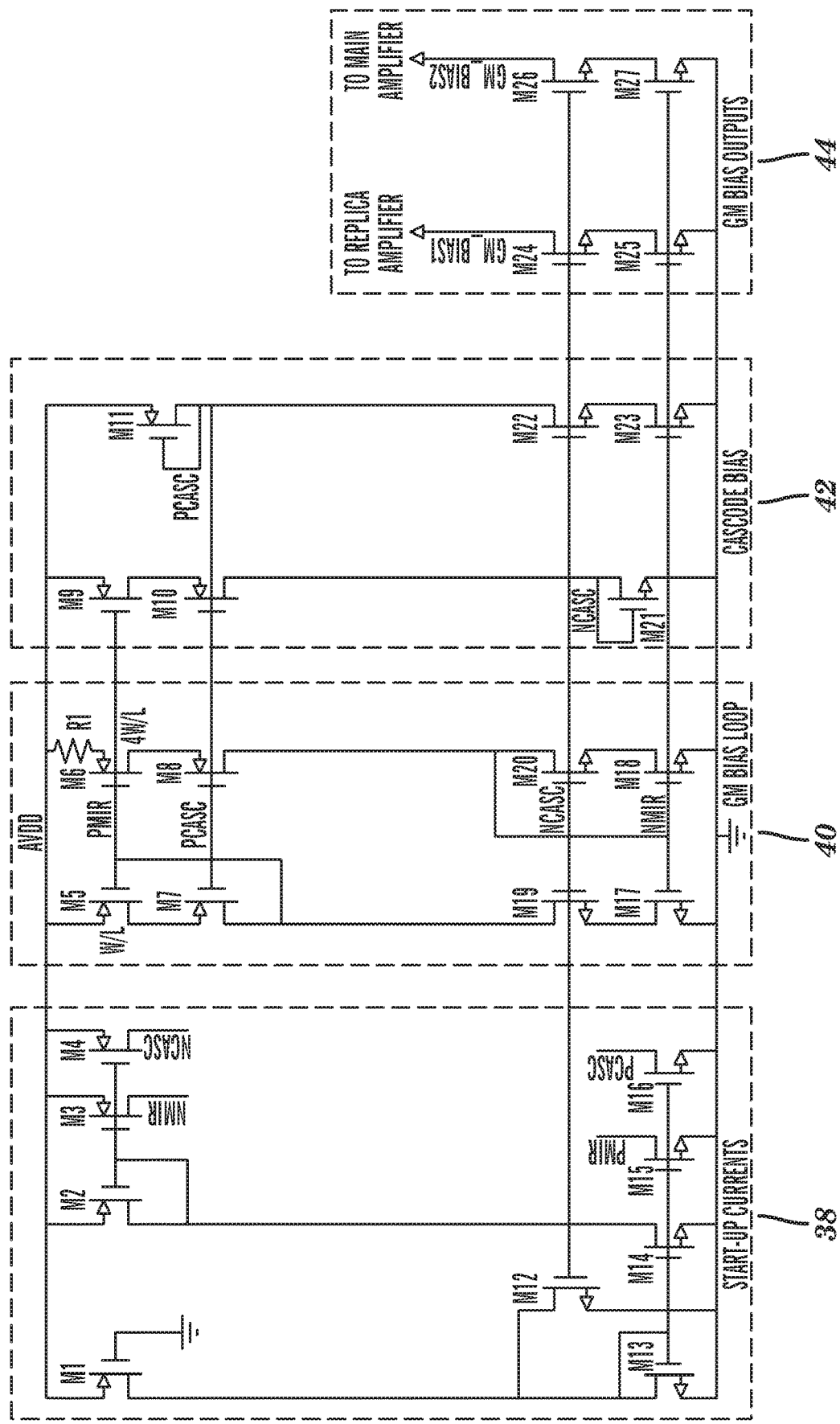
FIG. 7 is a schematic of an exemplary GM bias cell for use with the integrated amplifier circuit illustrated in FIGS. 1 and 2.

An exemplary Gm bias cell 20 is illustrated in FIG. 7 and includes a startup circuit 38, a Gm bias loop 40, a cascode bias 42, and Gm bias outputs 44. The startup circuit 38 provides startup currents for the Gm bias cell 20. The Gm bias loop 40 is a standard Gm bias loop for generating the transconductance bias (Gm BIAS) to be delivered to the replica amplifier 12 and the main amplifier 14 through the Gm bias outputs 44. The Gm bias loop 40 generates an identical Gm bias to be delivered to both the replica amplifier 12 and the main amplifier 14. In this example, the Gm bias cell 20 also includes a circuit portion for providing a cascode bias 42.

An exemplary operation of the integrated amplifier circuit 10 will now be described with reference to FIGS. 1 and 3-7. The integrated amplifier circuit 10 functions to extract small-signal information from a noisy environment. The integrated amplifier circuit 10 provides a function similar to an instrumentation amplifier, in that it represents a fixed value of differential gain and presents a small load to the input source (S). However, in one example, the integrated amplifier circuit 10 is designed to accept information that modulates a carrier of roughly 1 to 10 MHz. As the carrier is above the 1/f noise corner of the MOSFET devices that are employed, the integrated amplifier circuit 10 affords the possibility of removing 1/f noise and other out-of-band signals, by subsequent filtering. The integrated amplifier circuit 10 further is designed with minimal devices in the signal path, leading to a wide bandwidth and lower noise, even for DC signals.

In this example, the input source (S) provides an alternating current to the main amplifier 14, although in other examples direct current sources could be utilized, such as with the exemplary circuit illustrated in FIG. 2. The input source (S) provides a differential input signal to the differential inputs of the main amplifier 14. The main amplifier 14, in turn, increases the differential input signal by a fixed, stable gain to provide a differential output signal. The differential output signal is delivered to the pins OUTP and OUTN of the main amplifier 14 and may be utilized for a number of applications. To avoid loading the input source (S) or reducing Q in the case of a tuned circuit source, no feedback elements are connected to the inputs of the main amplifier 14. This makes an alternate method necessary to stabilize gain over process variations, supply voltage changes, and temperature. In this example, the main amplifier 14 receives a bias from both the replica LNA 12 and the Gm bias cell 20 as illustrated in FIGS. 1 and 2 and described below.

The generated bias provided to the main amplifier 14 will now be described with respect to FIGS. 4-7. The replica LNA 12 receives bias signals $\Delta V$ and $\Delta I$ from the voltage and current reference circuit 16, such as the exemplary voltage and current reference circuit shown in FIG. 6. Referring now more specifically to FIG. 6, generation of the bias signals $\Delta V$ and $\Delta I$ will be described. To generate the $\Delta I$ bias signal, the operational amplifier (A2) of the voltage-current converter circuit 28 receives a reference voltage (VR). The operational amplifier (A2) utilizes the reference voltage (VR) and the on-chip resistor (R3) to develop a reference current (IR), given by the following equation:

$$IR=VR/R3 \quad (1)$$

The differential current generator 30 receives the generated reference current (IR) and mirrors the reference current (IR) to generate a differential current ($\Delta I$), given by the following equation:

$$\Delta I 32 \ (IP-IN)=2*IR=2*(VR/R3) \quad (2)$$

The differential current generator 30 then delivers the differential current as an input signal to the output of the replica LNA 12 to bias the replica LNA 12 as shown in FIG. 1.

To generate the input signal, the differential voltage generator 32 also receives the generated reference current (IR) and mirrors the reference current (IR) through resistors R4 and R5 to generate the differential voltage $\Delta V$:

$$\Delta V=(VP-VN)=IR*(R4+R5)=(VR/R3)*(R4+R5) \quad (3)$$

The differential voltage generator 32 then delivers the differential voltage ($\Delta V$) to the input of the replica LNA 12 to bias the replica LNA 12 as shown in FIGS. 1 and 2.

Referring again to FIG. 6, resistor R6 sets the voltage-common mode (VCM), which is in turn used for the reset switches 22(1) and 22(2) to set the common mode as employed in FIG. 1, which utilizes an alternating current source.

In another example, the integrated amplifier circuit 10 is implemented without a voltage reference as described below. In this example, a bias current (IB) can be used in place of the derived current from the voltage reference (VR). The same current used for IP and IN is used to generate the differential voltage ($\Delta V$), so the transconductance (Gm) is again inversely proportional to the on-chip resistors as shown in the following equations. The differential voltage is given by the equation:

$$\Delta V=(VP-VN)=IB*(R4+R5) \quad (4)$$

The differential current is given by the equation:

$$\Delta I=2*IB \quad (5)$$

The transconductance is the ratio of the differential current to the different voltage:

$$Gm=\Delta I/\Delta V=2/(R4+R5) \quad (6)$$

Thus, the voltage gain of the circuit is given by the following equation:

$$Av=Gm*RL=2*RL/(R4+R5) \quad (7)$$

Thus, the bias current (IB) will have no impact on voltage gain to the degree that the resistors utilized match. However, the basis for the bias current (IB) (MOSFET Vt or bipolar Vbe, by way of example) will impact the common-mode voltage (VCM) in this example. As shown in FIG. 1, the $\Delta V$ bias signal is delivered to the input of the replica LNA 12, while the $\Delta I$ bias bucks the output of the replica LNA 12.

Referring now more specifically to FIG. 4, internal feedback within the replica LNA 12 sets the transconductance (Gm) of the replica LNA 12 such that its gain is the ratio of the differential current ($\Delta I$) to the differential voltage ($\Delta V$) as described below. The tail current under feedback control is added to that from the Gm bias cell 20, as described in further detail below. At a given input pair transconductance (Gm) and differential input voltage ($\Delta V=VP-VN$), a specific differential output current results ($\Delta I=IOP-ION$) that appears in the sources M1 and M2. Since $Gm=\Delta I/\Delta V$ ($\Delta I=\Delta V*Gm$), if the M1 drain current is too large, it drives the operation amplifier (A1) noninverting upward, causing the A1 output to increase and reduce tail current. This reduces Gm bias as well as the fraction of current steered to M1. This, in turn, reduces voltage at the inverting input. Thus, negative feedback drives the inputs of the operational amplifier (A1) to balance and does so at the transconductance (Gm) required to absorb the applied input current at the applied input voltage. The relationship between the tail current and Gm is square-root, this non-linearity is absorbed by the feedback loop gain.

A copy of the replica bias current $\Delta I/\Delta V$ from the replica LNA 12 is sent to the main amplifier 14 as shown in FIG. 1 to bias the main amplifier 14. In this manner, the bias of the main amplifier 14 is slaved to the bias of the replica LNA 12. The result is that the gain of the main amplifier 14 is equal to the ratio of two on-chip resistors, just as in a standard feedback amplifier, as described further below. The replica bias current from the replica LNA 12 has the added advantage that it sets the output common-mode voltage without a separate feedback loop. This provides the added benefit that no feedback connections are made to the amplifier input.

Referring again to FIG. 4, the replica LNA 12 is placed in a feedback loop, forcing it to maintain transconductance (Gm) that is proportional to the inverse value of an on-chip resistor. The result is that the gain of the main amplifier is equal to the ratio of two on-chip resistors, just as in a standard feedback amplifier.

The feedback loop of the replica LNA 12 will now be described. As shown in FIG. 4, the replica LNA 12 generates output currents (IL) and output voltages (VL). The output currents (IL) of the replica LNA 12 flow through the equal valued load resistors (RL). The output voltages (VL) are sensed by operational amplifier (A1). The operational amplifier (A1) drives the tail current (I_TAIL) to set the transconductance (Gm) of the replica LNA 12. The operational amplifier (A1) drives the tail current (I_TAIL) such that A1's input voltages are equal. This means the replica LNA 12 circuit as illustrated in FIG. 4 has a stable state at VL=0 and IL =0. Thus, the startup circuit 26 is needed as illustrated in FIG. 5.

Referring now more specifically to FIG. 5, in this example a fraction of the tail current (I_TAIL) comes from the GM bias cell 20, while the remaining required current is provided by the operational amplifier (A1) driven tail current. In this manner, the zero current state is avoided. Note that the input current (IP) is equal to the current (IOP) and the input current (IN) is equal to current (ION) as shown in FIG. 5. The tail current (I_TAIL) is at the gate of PMOS device M9. As this node is pulled downward, M9's tail current contribution increases, which introduces another inversion in the feedback loop that must be taken into account.

Resistive loads (R1 and R2) are utilized in the replica LNA 12 to reduce noise. Since the load resistors (R1 and R2) match and the operational amplifier (A1) inputs are equal, $\Delta I$ currents (IP) and (IN) cannot flow through transistors M3 or M4. Current (IOP) represents a decrease in M2 bias current from the balanced (I_TAIL/2) value, but a standing current still flows in M2, from source to drain. Similarly M1 current is tilted from balance, but carries a standing current. As the differential input voltage ($\Delta V$) is varied, the source-coupled pair of transistors M1 and M2 will steer the tail current (I_TAIL) from one side of the pair (M1) to the other (M2). For VP>VN, in the small-signal range, a fraction of tail current (I_TAIL) will be steered toward M1 and away from M2.

At a given input pair transconductance (Gm) and differential input voltage ($\Delta V$=VP–VN), a specific differential output current results ($\Delta I$=IOP–ION). Since GM=$\Delta I/\Delta V$ ($\Delta I$=$\Delta V$*GM), if the M1 drain current is too large, it drives the operational amplifier (A1) inverting input upward, causing the output to decrease and reduce tail current. This reduces GM bias as well as the fraction of current steered to M1. This in turn, reduces voltage at the inverting input. Thus, negative feedback drives the operational amplifier (A1) inputs to balance and does so at the transconductance (GM) required to absorb the applied input current at the applied input voltage. The relationship between the tail current and GM is a square -root, but this is absorbed by the gain of the feedback loop.

Referring again to FIG. 5, operational amplifier (A1) drives the servo -loop 24 around the replica LNA 12. A second tail current source is controlled by operational amplifier (A1) and is in parallel with the temperature dependent current mirrored through M7 and M8. This sets the bias such that the amplifier differential output current absorbs $\Delta I$ at the input voltage $\Delta V$.

By providing a current, outside the operational amplifier (A1) servo loop 24, the tail current is brought closer to the correct value. The current source controlled by the operational amplifier (A1) requires less strength than it otherwise would since it is making only a small correction. This avoids the situation where the loop finds an undesired stable state with excess current, which would force a large drop across the load resistors and push the cascode devices into triode mode.

As long the desired bias condition is maintained, the replica LNA 12 maintains a transconductance that is inversely proportional to the on-chip resistors. The transconductance is given by the following equation:

$$Gm=\Delta I/\Delta V=[2*(VR/R3)/[(VR/R3)*R4+R5)]=2/(R4+R5) \quad (8)$$

Gm is set proportional to the inverse of (R4+R5) and tracks this value over process and temperature. Amplifier gain (Av) then is:

$$Av=Gm*RL=2*RL/(R4+R5) \quad (9)$$

The voltage gain is proportional to the ratio of the resistors, just as in a standard voltage feedback amplifier. The nominal gain is set to 10× (20 dB). This first-stage gain reduces the impact of noise of subsequent amplifier stages by a factor of 100.

Mismatch in current mirrors of the replica LNA 12 is absorbed by the feedback loop. Offset in the bias operational amplifier and mismatch between the tail currents of the replica LNA 12 and main amplifier 14 appear as an initial gain error. The fixed tail current also reduces the bias circuit loop-gain, which enhances stability. This is similar to techniques used in many common-mode feedback loops where only a couple of stripes of a tail current device are under feedback control, while the remaining stripes of the tail current device are biased in a static manner.

A standard resistor dependent GM bias cell 20, as shown in FIG. 7, provides a temperature dependent current to part of the tail current of both the main amplifier 14 and the replica LNA 12 (as shown in FIG. 1), which provides a GM bias. This sets the bias close to that necessary to achieve the correct transconductance.

Noise generated by the bias circuits reaches the main amplifier 14 itself only as a common-mode signal. Bias circuit noise is largely rejected as it is common-mode and is also filtered by the low bandwidth of the bias loop. The integrated amplifier circuit 10 also provides sufficient gain to make subsequent gain stage noise negligible. As such, its impact is greatly reduced as it makes an impact only to the degree that the devices mismatch. The input is comprised of a cross-quad of large devices so matching is optimum. Noise of the bias circuit is also reduced by the compensation of the feedback loop.

Accordingly, examples of the present technology provide an integrated amplifier device that is low-noise, provides a wide bandwidth, may be AC or DC coupled, and provides performance over the military temperature range. The amplifier of the present technology is designed to be rugged and transportable to multiple integrated circuit processes. The present technology advantageously allows for the extraction of small signals from a noisy environment and rejects common -mode signals without loading the signal source, while maintaining stable gain, low noise, and wide bandwidth. The technology may be implemented in standard CMOS making it viable for large, integrated, mixed-signal systems.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. An integrated amplifier device comprising:
a main amplifier configured to be coupled to an input source;
a replica amplifier coupled to the main amplifier to provide a bias to the main amplifier;
a transconductance biasing cell coupled to the main amplifier and the replica amplifier, wherein the transconductance biasing cell is configured to bias both the main amplifier and the replica amplifier; and
a differential voltage source coupled to the replica amplifier to provide a differential voltage and a differential current source coupled to the replica amplifier to provide a differential current.

2. The integrated amplifier device of claim 1, wherein the differential voltage source is coupled to an input of the replica amplifier and the differential current source is coupled to an output of the replica amplifier.

3. The integrated amplifier device of 1, wherein the bias provided by the replica amplifier to the main amplifier is based on the differential voltage and the differential current.

4. The integrated amplifier device of claim 3, wherein the bias provided to the main amplifier from the replica amplifier is based on a ratio of the differential current to the differential voltage.

5. The integrated amplifier device of claim 1, wherein the replica amplifier comprises a feedback loop to set a transconductance of the replica amplifier.

6. The integrated amplifier device of claim 1, wherein the main amplifier is coupled to an alternating current source.

7. The integrated amplifier device of claim 6 further comprising:
a pair of reset switches located between the source and the main amplier to set an input common mode of an input signal delivered to main amplifier from the source.

8. The integrated amplifier device of claim 1, wherein an input of the main amplifier is without any feedback element.

9. A method of making an integrated amplifier device, the method comprising:
providing a main amplifier configured to be coupled to an input source;
coupling a replica amplifier to the main amplifier to provide a bias to the main amplifier;
coupling a transconductance biasing cell to the main amplifier and the replica amplifier, wherein the transconductance biasing cell is configured to bias both the main amplifier and the replica amplifier;
coupling a differential voltage source to the replica amplifier to provide a differential voltage; and
coupling a differential current source coupled to the replica amplifier to provide a differential current.

10. The method of claim 9, wherein the differential voltage source is coupled to an input of the replica amplifier and the differential current source is coupled to an output of the replica amplifier.

11. The method of claim 9, wherein the bias provided by the replica amplifier to the main amplifier is based on the differential voltage and the differential current.

12. The method of claim 11, wherein the bias provided to the main amplifier from the replica amplifier is based on a ratio of the differential current to the differential voltage.

13. The method of claim 9, wherein the replica amplifier comprises a feedback loop to set a transconductance of the replica amplifier.

14. The method of claim 9 further comprising:
coupling the main amplifier to an alternating current source.

15. The method of claim 14 further comprising
providing a pair of reset switches located between the source and the main amplier to set an input common mode of an input signal delivered to main amplifier from the source.

16. The method of claim 9, wherein an input of the main amplifier is without any feedback element.

* * * * *